United States Patent
Kitamura et al.

(10) Patent No.: US 7,355,379 B2
(45) Date of Patent: Apr. 8, 2008

(54) COAXIAL TYPE IMPEDANCE MATCHING DEVICE AND IMPEDANCE DETECTING METHOD FOR PLASMA GENERATION

(75) Inventors: Toshiaki Kitamura, Nagano (JP); Koichi Rokuyama, Nagano (JP); Shigeru Kasai, Yamanashi (JP); Takashi Ogino, Yamanashi (JP); Yuki Osada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 11/370,780

(22) Filed: Mar. 8, 2006

(65) Prior Publication Data

US 2006/0144519 A1 Jul. 6, 2006

Related U.S. Application Data

(62) Division of application No. 10/951,049, filed on Sep. 27, 2004, now Pat. No. 7,176,634, which is a division of application No. 10/441,899, filed on May 20, 2003, now Pat. No. 6,819,052.

(30) Foreign Application Priority Data

| May 31, 2002 | (JP) | .......................... P. 2002-158721 |
| Oct. 29, 2002 | (JP) | .......................... P. 2002-313818 |

(51) Int. Cl.
*G01R 23/00* (2006.01)
*G01R 25/00* (2006.01)

(52) U.S. Cl. ................. 324/76.52; 324/76.77; 327/7

(58) Field of Classification Search ........... 315/111.21; 327/3, 7, 40, 44; 324/76.52, 76.77; 204/298.08, 204/298.23, 298.35
See application file for complete search history.

(56) References Cited

U.S. PATENT DOCUMENTS 7,084,409 B1 * 8/2006 Danielson ................ 250/458.1

FOREIGN PATENT DOCUMENTS

JP 09-260096 10/1997

OTHER PUBLICATIONS

Patent Abstracts of Japan; English translation issued for Publication No. 09-260096; dated Oct. 3, 1997; (2 pages).

* cited by examiner

*Primary Examiner*—Thuy Vinh Tran
(74) *Attorney, Agent, or Firm*—Osha Liang LLP

(57) ABSTRACT

A plasma generating method generates plasma in a treating chamber by controlling a high-frequency generating unit to generate a high-frequency signal and by feeding the high-frequency signal to the treating chamber through an impedance matching device. The plasma generating method includes controlling the impedance matching device, when the plasma is generated in the treating chamber, so as to satisfy a preset matching condition, and then controlling the high-frequency generating unit to generate and feed the high-frequency signal of the power generating the plasma, to the treating chamber.

5 Claims, 7 Drawing Sheets

COAXIAL TYPE IMPEDANCE MATCHING DEVICE AND IMPEDANCE DETECTING METHOD FOR PLASMA GENERATION

CROSS-REFERENCE TO RELATED APPLICATIONS

This patent application is a divisional application of U.S. patent application Ser. No. 10/951,049, filed Sep. 27, 2004, which is now U.S. Pat. No. 7,176,634, which is a divisional of U.S. patent application Ser. No. 10/441,899, filed May 20, 2003, which is now U.S. Pat. No. 6,819,052.

The present disclosure relates to the subject matter contained in Japanese Patent Application No. 2002-158721 filed on May 31, 2002 and Japanese Patent Application No. 2002-313818 filed on Oct. 29, 2002, which are incorporated herein by reference in its entirety.

BACKGROUND OF THE INVENTION

1. Field of the Invention

The present invention relates to a plasma generating method for generating a plasma by inputting a high-frequency signal to a treating chamber through an impedance matching device, and also relates to a plasma apparatus and a semiconductor manufacturing apparatus for subjecting a predetermined treatment to an object by using the plasma generated.

2. Description of the Related Art

Generally, with regard to a plasma apparatus, even when a treating chamber itself has the common structure, the input impedance of the treating chamber changes according to the kind of an object in the treating chamber. Therefore, even if individual matching elements of a matching device body are moved to matching positions predetermined by the experiments or the experiences, there may occur a situation in which the impedance between a high-frequency generating unit and the treating chamber 5 cannot be accurately matched. In this state, a high-frequency signal S is not efficiently fed to the treating chamber, and the plasma may not be ignited. In case the plasma is not ignited, moreover, it becomes difficult to execute the treatment of the object promptly.

Also, when the impedance matching is conducted in the plasma apparatus according to the related art, the individual matching elements have to be moved to the matching positions by making the reflectivity come close to a reference value while repeating the feedback controls to control the positions of the individual matching elements individually. Therefore, the plasma apparatus according to the related art has a problem that it takes a long time to match the impedance. Moreover, the impedance matching actions have been ended at a time when the reflectivity reaches the reference value. This raises a problem that it is difficult to move the individual matching elements to the more complete matching positions although the individual matching elements have those complete positions.

SUMMARY OF THE INVENTION

The present invention has been conceived in view of that point to be improved and has a main object to provide a plasma generating method and a plasma apparatus, which can ignite a plasma efficiently and reliably. Another object of the invention is to provide a semiconductor manufacturing apparatus, which is enabled to execute a treatment promptly on an object by igniting the plasma efficiently and reliably.

The invention also has still another object to provide a phase difference detecting method and a measuring device, which can detect such a phase difference between a progressive wave and a reflected wave at a high speed as is necessary for determining the matching positions of individual matching elements in an impedance matching device. Further another object of the invention is to provide an impedance detecting method and a measuring device, which can detect such an input impedance of an impedance matching device at a high speed as is necessary for determining the matching positions in an impedance matching device connected with a directional coupler. Yet another object is to provide a coaxial type impedance matching device, which can increase the impedance matching speed of a matching object and make the impedance matching degree more complete.

To accomplish the above objects, according to a first aspect of the invention, a plasma generating method generates a plasma in a treating chamber by controlling a high-frequency generating unit to generate a high-frequency signal and by feeding the high-frequency signal to the treating chamber through an impedance matching device. The plasma generating method includes controlling the high-frequency generating unit to generate and feed a high-frequency signal having a lower power than that generating plasma, to the treating chamber;, measuring a reflectivity as a ratio of a reflected wave to a progressive wave between the high-frequency generating unit and the treating chamber in a state of feeding the high-frequency signal having the lower power than that generating plasma to the treating chamber, controlling the impedance matching device on the basis of at least the reflectivity measured to define a matching condition of the impedance matching device in which the reflectivity is not higher than a defined value, as a preset matching condition, controlling the impedance matching device, when the plasma is generated in the treating chamber, so as to satisfy the preset matching condition, and then controlling the high-frequency generating unit to generate and feed the high-frequency signal of the power generating the plasma, to the treating chamber.

Also, according to a second aspect of the invention, a plasma apparatus includes a high-frequency generating unit for generating a high-frequency signal, a treating chamber for generating a plasma therein when the high-frequency signal is fed thereto, the treating chamber for executing a predetermined treatment on a contained object with the plasma, an impedance matching device arranged between the high-frequency generating unit and the treating chamber, for matching an impedance therebetween, a measuring unit for measuring a reflectivity as a ratio of a reflected wave to a progressive wave between the high-frequency generating unit and the treating chamber, and a control unit for controlling the impedance matching device. The impedance matching device includes a cylindrical external conductor, a column-shaped internal conductor arranged in the external conductor so that an axis of the external conductor and that of the internal conductor are identical, dielectrics being movable in a longitudinal direction of the internal conductor and disposed in clearance between the inner face of the external conductor and the outer face of the internal conductor, and a moving mechanism for moving the dielectrics. The control unit controls the high-frequency generating unit to generate and feed the high-frequency signal having a lower power than that generating the plasma, to the treating chamber, controls the moving mechanism on the basis of at least the reflectivity measured in a state of feeding the high-frequency signal having the lower power than that generating plasma to the treating chamber, defines positions, at which the reflectivity is not higher than a defined value, of the dielectrics in the impedance matching device, as preset positions, and controls the moving mechanism, when the plasma is generated in the treating chamber, to move the dielectrics to the preset positions.

According to a third aspect of the invention, a phase difference detecting method includes inputting a first input signal and a second input signal, which are identical in frequency to each other and are different in phase from each other, generating a first generated signal and a second generated signal, which are identical in frequency to and different by a first reference phase difference from the first input signal, on the basis of the first input signal, generating a third generated signal and a fourth generated signal, which are identical in frequency and are different by a second reference phase difference from the second input signal, on the basis of the second input signal, mixing the first generated signal and the third generated signal to detect relative phase difference between the first generated signal and the third generated signal, as a first relative phase difference, mixing the second generated signal and the fourth generated signal to detect relative phase difference between the second generated signal and the fourth generated signal, as a second relative phase difference, and referring to a relationship prepared in advance among the first relative phase difference, the second relative phase difference, and a true phase difference between the first input signal and the second input signal, to detect the true difference.

In this case, it is preferable that the first reference phase difference is 90 degrees, and that the second reference phase difference is 0 degree.

According to a fourth aspect of the invention, an impedance detecting method including inputting a progressive wave and a reflected wave output by a directional coupler connected to an object to be connected, as a first input signal and a second input signal, which are identical in frequency to each other and are different in phase from each other, generating a first generated signal and a second generated signal, which are identical in frequency to and different by a first reference phase difference from the first input signal, on the basis of the first input signal, generating a third generated signal and a fourth generated signal, which are identical in frequency and are different by a second reference phase difference from the second input signal, on the basis of the second input signal, mixing the first generated signal and the third generated signal to detect relative phase difference between the first generated signal and the third generated signal, as a first relative phase difference, mixing the second generated signal and the fourth generated signal to detect relative phase difference between the second generated signal and the fourth generated signal, as a second relative phase difference; referring to a relationship prepared in advance among the first relative phase difference, the second relative phase difference, and a true phase difference between the first input signal and the second input signal, to detect the true difference, mixing the first generated signal and the third generated signal to detect an amplitude ration of the third generated signal to the first generated signal, mixing the second generated signal and the fourth generated signal to detect an amplitude ration of the fourth generated signal to the second generated signal, and detecting an input impedance of the object to be connected on the basis of the detected true phase difference between the progressive wave and the reflected wave, and the detected amplitude ratios.

According to a fifth aspect of the invention, a measuring device includes a first signal distributor for generating and distributing a first generated signal and a second generated signal, which are identical to each other in frequency and are different by a first reference phase difference from a first input signal inputted, on the basis of the first input signal, a second signal distributor to which a second input signal having the frequency identical to the first input signal and being different in phase from the first input signal is input, the second signal distributor for generating and distributing a third generated signal and a fourth generated signal, which are identical to each other in frequency and are different by a second reference phase, on the basis of the second input signal, a first mixing unit for mixing the first generated signal and the third generated signal to detect a relative phase difference between the first generated signal and the third generated signal as a first relative phase difference, a second mixing unit for mixing the second generated signal and the fourth generated signal to detect a relative phase difference between the second generated signal and the fourth generated signal as a second relative phase difference, and a detecting unit for detecting a true phase difference between the first input signal and the second input signal on the basis of the first relative phase difference and the second relative phase difference detected by the first mixing unit and the second mixing unit, the first reference phase difference, and the second phase difference.

In this case, it is preferable that the first reference phase difference is 90 degrees, and that the second reference phase difference is 0 degree.

Also, the measuring device may further include a directional coupler connected to an object to be connected, the first signal distributor, and the second signal distributor, and a calculation unit for calculating an input impedance of the object to be connected. The first input signal and the second input signal, which are output by the directional coupler, are input to the first signal distributor and the second signal distributor, respectively. One of the first mixing unit and the second mixing unit mixes the both generated signals to detect an amplitude ratio of the both generated signals. The calculation unit calculates the input impedance of the object to be connected on the basis of the true phase difference between the first input signal and the second input signal, which is detected by the detecting unit, and the detected amplitude ratio.

According to a sixth aspect of the invention, a coaxial type impedance matching device includes a tubular external conductor, an internal conductor disposed in the external conductor, a matching device body including a plurality of dielectrics being movable and disposed in clearance between an inner face of the external conductor and an outer face of the internal conductor, the matching device body disposed between a directional coupler and an object to be matched, a moving mechanism for moving the dielectrics, a storing unit for storing a data table in which an intrinsic impedance of the matching device body and a position of each of dielectrics are made to correspond, a measuring device, and a control unit for controlling the moving mechanism. The intrinsic impedance of the matching device body is controlled to a value corresponding to positions of the dielectrics in the external conductor. The measuring unit includes a first signal distributor for generating and distributing a first generated signal and a second generated signal, which are identical to each other in frequency and are different by a first reference phase difference from a first input signal inputted, on the basis of the first input signal, a second signal distributor to which a second input signal having the frequency identical to the first input signal and being different in phase from the first input signal is input, the second signal distributor for generating and distributing a third generated signal and a fourth generated signal, which are identical to each other in frequency and are different by a second reference phase, on the basis of the second input signal, a first mixing unit for mixing the first generated signal and the third generated signal to detect a relative phase difference between the first generated signal and the third generated signal as a first relative phase difference, a second mixing unit for mixing the second generated signal and the fourth generated signal to detect a relative phase difference between the second generated signal and the fourth generated signal as a second relative phase difference, a detecting unit for detecting a true phase difference between the first input signal and the second input signal on the basis of the first relative phase difference and the second relative phase difference detected by the first mixing unit and the second mixing unit, the first reference phase difference, and the second phase difference, the directional coupler connected to the matching device body, the first signal distributor, and the second signal distributor, and a calculation unit for calculating an input impedance of the object to be connected. The first input signal and the second input signal, which are output by the directional coupler, are input to the first signal distributor and the second signal distributor, respectively. One of the first mixing unit and the second mixing unit mixes the both generated signals to detect an amplitude ratio of the both generated signals. The calculation unit calculates the input impedance of the object to be connected on the basis of the true phase difference between the first input signal and the second input signal, which is detected by the detecting unit, and the detected amplitude ratio. The control unit calculates the input impedance of the object to be matched on the basis of the intrinsic impedance of the matching device body, which is obtained from the positions of the dielectrics in the matching device body and the data table, at a time of starting a matching operation, and the input impedance of the matching device body being as the object to be matched, which is calculated by the calculating unit of the measuring device, at the time of starting the matching operation, refers to the data table to calculate as target positions the positions of the dielectrics so that a conjugate impedance to the calculated input impedance of the matching device body and the intrinsic impedance are identical, and controls the moving mechanism to locate the dielectrics at the target positions, respectively.

DETAILED DESCRIPTION OF THE PREFERRED EMBODIMENT

First Embodiment

Figure 1:
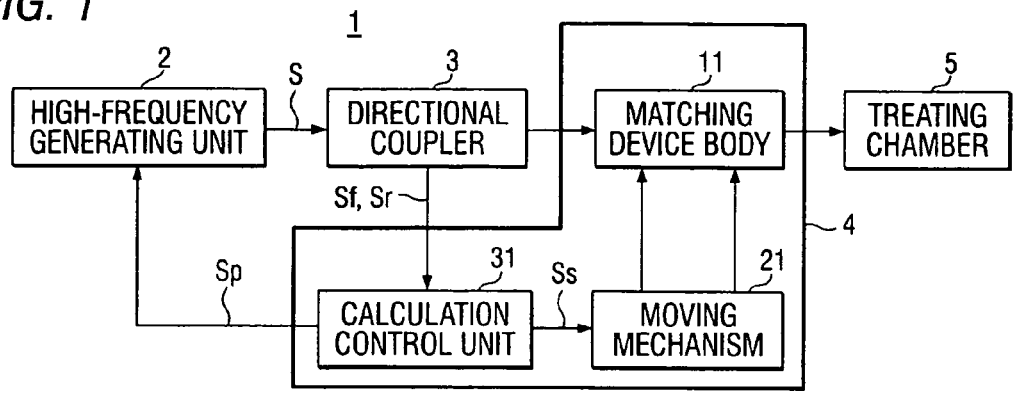
FIG. 1 is a construction diagram of a plasma CVD apparatus 1 including a plasma apparatus according to an embodiment of the invention.

Preferred embodiments of a plasma generating method, a plasma apparatus and a semiconductor manufacturing apparatus according to the invention will be described with reference to the accompanying drawings. Here will be described an example, in which a plasma apparatus is applied to a plasma CVD apparatus as the semiconductor manufacturing apparatus for forming a thin film on an object such as a semiconductor wafer by plasma-discharge decompositions of reactive gases. The plasma CVD apparatus 1, as shown in FIG. 1, is constructed to include a high-frequency generating unit 2, a directional coupler 3, a coaxial type impedance matching device 4 (referred to as "matching device"), and a treating chamber 5 (an object to be matched of the invention). The plasma apparatus 1 is enabled to subject an object in the treating chamber 5 to a thin film forming treatment, by feeding a high-frequency signal (e.g., a microwave) S generated by the high-frequency generating unit 2 to the treating chamber 5 through the directional coupler 3 and the matching device body 11 in the matching device 4, thereby to generate a plasma in the treating chamber 5 filled with the reactive gases.

The high-frequency generating unit 2 generates the high-frequency signal (e.g., a microwave of about 2.45 GHz) S and feeds it to the treating chamber 5. On the basis of a power control signal Sp inputted, moreover, the high-frequency generating unit can control the electric power of the high-frequency signal S to be generated. The directional coupler 3 outputs the progressive wave Sf and the reflected wave Sr of the high-frequency signal S. In this case, the progressive wave Sf and the reflected wave Sr are related to have identical frequencies but different phases.

Figure 2:
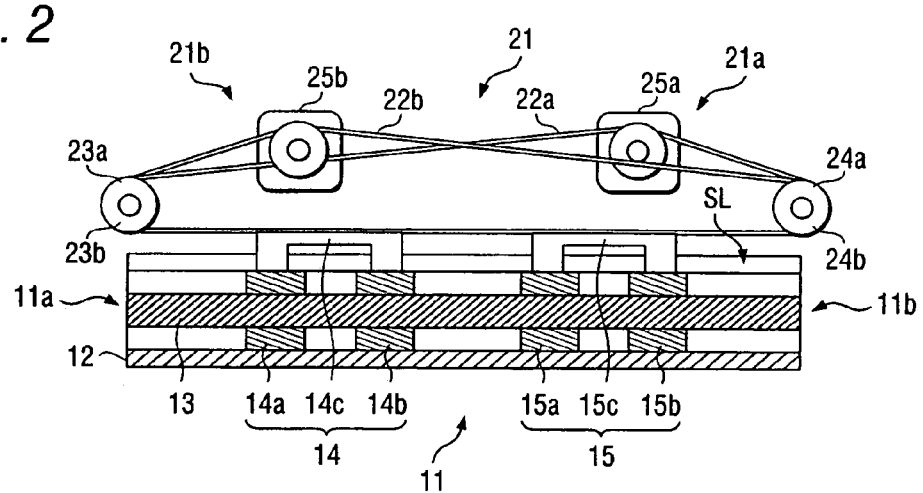
FIG. 2 presents a sectional side view of a matching device body 11 and a side view of a moving mechanism 21.

As shown in FIG. 1, the matching device 4 is provided with the matching device body 11, a moving mechanism 21 and an calculation control unit 31. In this case, as shown in FIG. 2, the matching device body 11 is arranged between the directional coupler 3 and the treating chamber 5 and is constructed as a coaxial type impedance matching device (or the so-called "slug tuner") including: a tubular (or cylindrical) external conductor 12; a circular-column shaped internal conductor 13 arranged in the external conductor 12 such that their axes may be aligned with each other; and two sets of dielectrics (or slugs) 14 and 15 arranged in the clearance between the inner face of the external conductor 12 and the outer face of the internal conductor 13. To the input end 11a and the output end 11b of the matching device body 11, there are attached the (not-shown) connectors, which connect the matching device body 11 individually with the directional coupler 3 and the treating chamber 5. One slit SL is formed in the longitudinal direction of the external conductor 12.

Figure 3:
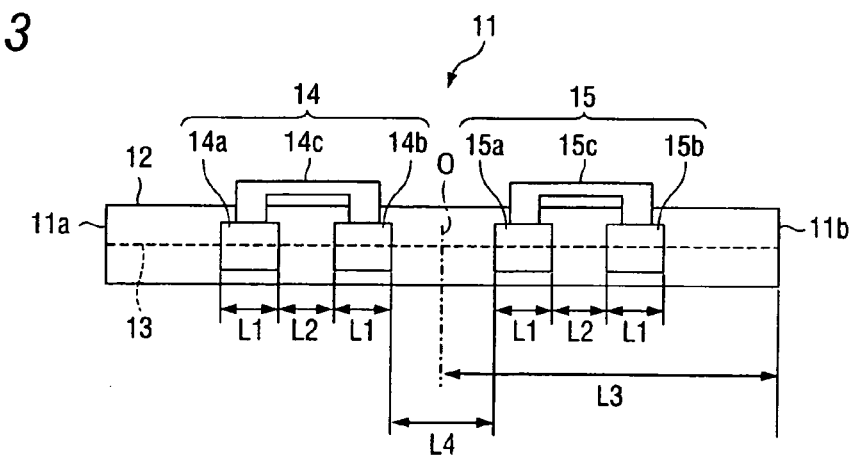
FIG. 3 is a conceptional diagram of the matching device body 11.

The slug 14 on the input end side is provided, as shown in FIGS. 2 and 3, with slugs 14a and 14b made of a dielectric material, and a moving bracket 14c for connecting the slugs 14a and 14b and being moved by the moving mechanism 21. In this case, the slugs 14a and 14b are formed into a circular-cylinder shape having a thickness L1 exactly (or substantially) equal to $\lambda/4$ (wherein $\lambda$ indicates a guide wavelength of the high-frequency signal Sin the matching device body 11). Moreover, the slugs 14a and 14b are so preset that the spacing distance L2 between their opposed faces is exactly or substantially equal to N×λ/4 (wherein N: an odd number). According to this constructed, the amount of reflection on the side of the input end 11a as the entirety of the slug 14 composed of the slugs 14a and 14b is sufficiently higher than that of the construction having only one of the slugs 14a and 14b. The moving bracket 14c is so inserted into the slit SL that its end portion (or the upper end of FIGS. 2 and 3) is protruded from the slit SL to the outside of the external conductor 12. The slug 15 on the output end side is made identical to the slug 14 and is provided, as shown in FIGS. 2 and 3, with slugs 15a and 15b made of a dielectric material, and a moving bracket 15c for connecting the slugs 15a and 15b and for being moved by the moving mechanism 21. Here in the embodiment of the invention, it is assumed, for example, that the distance L2 between the slugs 14a and 14b and the distance L2 between the slugs 15a and 15b are defined at λ/4.

At the time of matching the impedances using this matching device 4, the slugs 14 and 15 are slid (or moved). At this time, a distance L3 between the center position O between the slugs 14 and 15 and the output end (or the signal output side end portion) 11b of the matching device body 11 is adjusted to adjust the phases of the reflected signals which are reflected individually by the two slugs 14 and 15. In this case, the phases of the individual reflected signals by the two slugs 14 and 15 can be likewise adjusted, too, by adjusting the distance between the center position O between the two slugs 14 and 15 and the input end (or the signal input side end portion) 11a of the matching device body 11. Moreover, a distance L4 (i.e., the distance between the opposed faces) between the end face of the slug 14 on the side of the output end 11b of the slug 14b and the end face of the slug 15 on the side of the input end 11a of the slug 15a is adjusted to adjust the amplitude of the reflected signals, which are reflected to the side of the input end 11a by the output side slug 15. Therefore, the impedances between the high-frequency generating unit 2 to be connected with the input end 11a and the treating chamber 5 to be connected with the output end 11b can be completely matched by adjusting the positions of the slugs 14a and 14b (of the input side slug 14) and the slugs 15a and 15b (of the output side slug 15) suitably in the matching device body 11 (that is, the individual positions of the dielectrics 14 and 15 in the external conductor), to invert the phase of the signal reflected to the side of the input end 11a by the input side slug 14 and the phase of the signal reflected to the side of the input end 11a by the slug 15, from each other, and to equalize the amplitude of the signal reflected to the side of the input end 11a by the slug 14 and the amplitude of the signal reflected to the side of the input end 11a by the slug 15, to each other.

The moving mechanism 21 is constructed, as shown in FIG. 2, to include a moving mechanism 21a for moving the slug 14 and a moving mechanism 21b for moving the slug 15. The moving mechanism 21a is constructed to include a wire rope 22a made to run between a pair of pulleys 23a and 24a arranged near the input end 11a and the output end 11b of the matching device body 11, respectively, and a motor 25a for driving the wire rope 22a turnably. The moving bracket 14c of the slug 14 is connected to the wire rope 22a. With these constructions, the slug 14 is slid together with the moving bracket 14c in the external conductor 12 when the wire rope 22a is turnably driven by the motor 25a. On the other hand, the moving mechanism 21b is constructed to include a wire rope 22b made to run between a pair of pulleys 23b and 24b arranged near the input end 11a and the output end 11b of the matching device body 11, respectively, and a motor 25b for driving the wire rope 22b turnably. The moving bracket 15c of the slug 15 is connected to the wire rope 22b. With these constructions, the slug 15 is slid together with the moving bracket 15c in the external conductor 12 when the wire rope 22b is turnably driven by the motor 25b.

On the basis of the progressive wave Sf and the reflected wave Sr inputted, the calculation control unit (or a control unit of the invention) 31 measures the reflectivity as the ratio of the reflected wave Sr to the progressive wave Sf at the input end 11a of the matching device body 11. As a result, the calculation control unit 31 constructs a measuring unit of the invention together with the directional coupler 3. Moreover, the calculation control unit 31 matches the impedance between the directional coupler 3 and treating chamber 5 by controlling the amount of control Ss of the moving mechanism 21 to move the individual slugs 14 and 15 such that the reflectivity measured may be equal to or lower than the defined value stored in the (not-shown) internal memory. Moreover, the calculation control unit 31 controls the amount of control of the moving mechanism 21 thereby to move the slugs 14 and 15 individually to the preset positions stored in the internal memory or to the defined positions stored in advance. In this case, these defined positions mean that the matched positions of the individual slugs 14 and 15 in the individual states after the ignition of the plasma and are determined in advance by experiments, for example. Moreover, the calculation control unit 31 generates the power control signal Sp and outputs it to the high-frequency generating unit 2 thereby to control the generated power of the high-frequency signal S by the high-frequency generating unit 2.

The treating chamber 5 is formed of quartz to have a tubular contour, for example, although not shown, and is provided at its one end portion with the (not-shown) pump for discharging the gas in the treating chamber 5 and at its other end portion with the (not-shown) gas inlet port for introducing the reactive gas into the treating chamber 5. In the treating chamber 5, moreover, there is disposed the (not-shown) stage for placing an object to be treated. When the plasma is to be ignited, moreover, the treating chamber 5 is filled therein with the reactive gas.

Next, the actions of the plasma CVD apparatus 1 will be described with reference to FIGS. 4 to 7.

Figure 4:
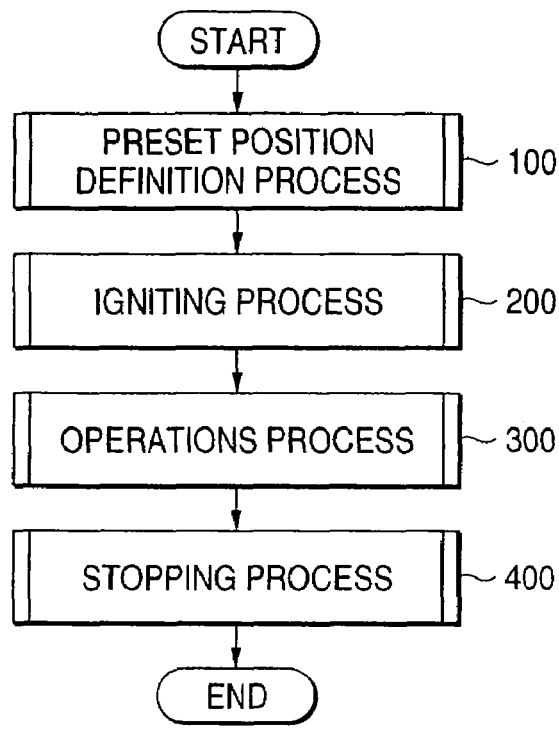
FIG. 4 is a flow chart for explaining a film forming operation of the plasma CVD apparatus 1.
Figure 5:
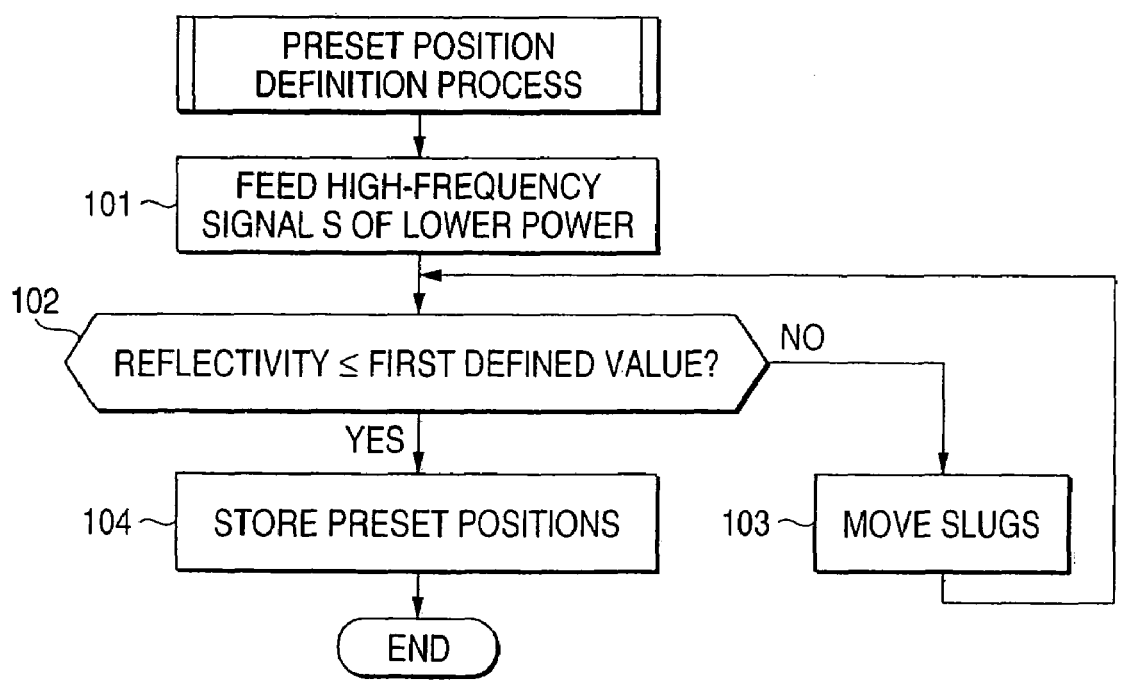
FIG. 5 is a flow chart for explaining a preset position defining processing in FIG. 4.

When the power is turned ON, a preset position definition shown in FIG. 4 is executed (at Step 100) to detect the matching state at the plasma igniting time and to store it as the preset position. As shown in FIG. 5, more specifically, the calculation control unit 31 outputs the power control signal Sp to the high-frequency generating unit 2, and generates and feeds the high-frequency signal S of a lower power (or a power so low as cannot ignite the plasma) than that generating the plasma to the treating chamber 5 (at Step 101). On the basis of the progressive wave Sf and the reflected wave Sr, the calculation control unit 31 then measures the reflectivity in the input end 11a of the matching device body 11 and determines whether or not the reflectivity measured is not higher than a first defined value (at Step 102). When it is determined that the measured reflectivity exceeds the first defined value, the calculation control unit 31 controls the control amount Ss of the moving mechanism 21 to lower the reflectivity thereby to move the slugs 14 and 15 individually (at Step 103). The calculation control unit 31 repeats the aforementioned Steps 102 and 103 to lower the measured reflectivity gradually. When it is determined at Step 102 that the measured reflectivity is not higher than the first defined value (namely, when the impedance between the directional coupler 3 and the treating chamber 5 is matched), on the other hand, the calculation control unit 31 detects (or calculates) the present positions of the slugs 14 and 15 individually on the basis of the control amount Ss of the moving mechanism 21. Moreover, the detected positions of the slugs 14 and 15 are defined as the preset positions (or the preset matching conditions) and are stored in the internal memory (at Step 104).

Figure 6:
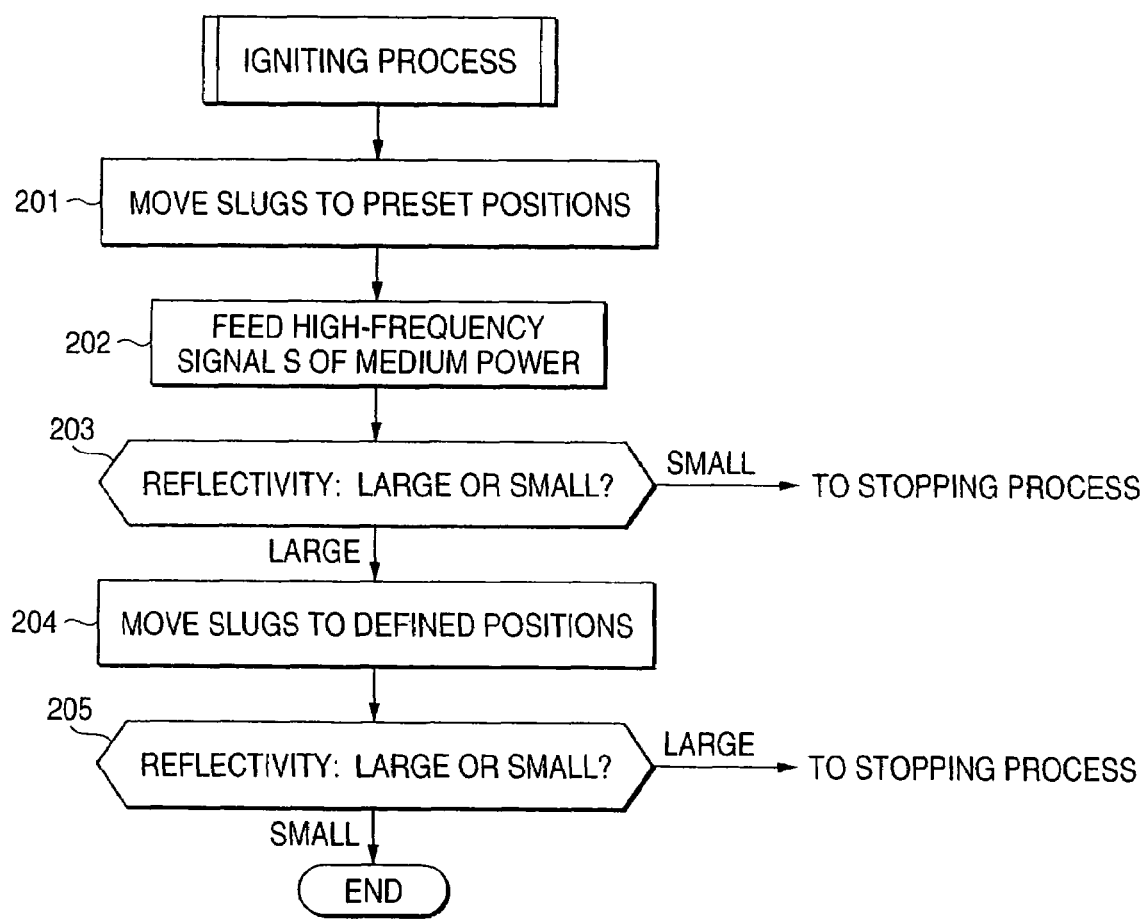
FIG. 6 is a flow chart for explaining an igniting processing in FIG. 4.

In the plasma CVD apparatus 1, as shown in FIG. 4, the calculation control unit 31 then executes the igniting processing to ignite the plasma in the treating chamber 5 (at Step 200). As shown in FIG. 6, more specifically, the calculation control unit 31 reads the preset positions of the individual slugs 14 and 15 from the internal memory and controls the control amount Ss of the moving mechanism 21 to move the individual slugs 14 and 15 in the matching device body 11 to the preset positions (at Step 201). In short, the individual slugs 14 and 15 are moved to satisfy the preset matching conditions. Next, the calculation control unit 31 outputs the power control signal Sp, and causes the high-frequency generating unit 2 to generate and feed a high-frequency signal S of such a medium power to the treating chamber 5 as can ignite the plasma (at Step 202). On the basis of the progressive wave Sf and the reflected wave Sr, the calculation control unit 31 then measures the reflectivity at the input end 11a of the matching device body 11 and determines whether or not the measured reflectivity is not higher than a second defined value (i.e., determines the magnitude of the reflectivity) (at Step 203). When the plasma is ignited in the treating chamber 5, the input impedance of the treating chamber 5 drops to a far lower level than that before the ignition. Therefore, the impedance between the high-frequency generating unit 2 and the treating chamber 5 shifts to an unmatched state so that the measure reflectivity increases. When it is determined that the measured reflectivity is not higher than the second defined value (namely, the reflectivity is low), therefore, the calculation control unit 31 determines that the ignition of the plasma has failed, and shifts to a stopping processing (at Step 400) shown in FIG. 4. When it is determined that the measured reflectivity exceeds the second defined value (namely, the reflectivity is high), on the other hand, the calculation control unit 31 determines that the plasma has been normally ignited. At this time, the calculation control unit 31 reads the aforementioned defined positions after the plasma ignition from the internal memory, and controls the control amount Ss of the moving mechanism 21, thereby to move the individual slugs 14 and 15 in the matching device body 11 to those defined positions (at Step 204).

Next, the calculation control unit 31 measures the reflectivity at the input end 11a of the matching device body 11 (between the high-frequency generating unit 2 and the treating chamber 5), and determines whether the measured reflectivity is not higher than a third defined value (i.e., determine the magnitude of the reflectivity) (at Step 205). In this case of the state, in which the impedance between the high-frequency generating unit 2 and the treating chamber 5 is matched by moving the individual slugs 14 and 15 to the defined positions at Step 204, the reflectivity is low. When it is determined that the measured reflectivity is not higher than the third defined value (the reflectivity is low), therefore, the calculation control unit 31 determines that the impedance between the high-frequency generating unit 2 and the treating chamber 5 has been matched in the ignition state, and ends this routine and then transfers to the operations processing shown in FIG. 4. When it is determined that the measured reflectivity has exceeded the third defined values (that is, the reflectivity is high), on the other hand, the plasma once ignited is caused to transfer to an abnormal state (to a not-ignited state) by some reason such as the movements of the individual slugs 14 and 15. As a result, the calculation control unit 31 determines that the state has transferred to the unmatched impedance state, and transfers to the stopping processing (Step 400) shown in FIG. 4. Incidentally, the first, second, and third defined values may be the same value.

Figure 7:
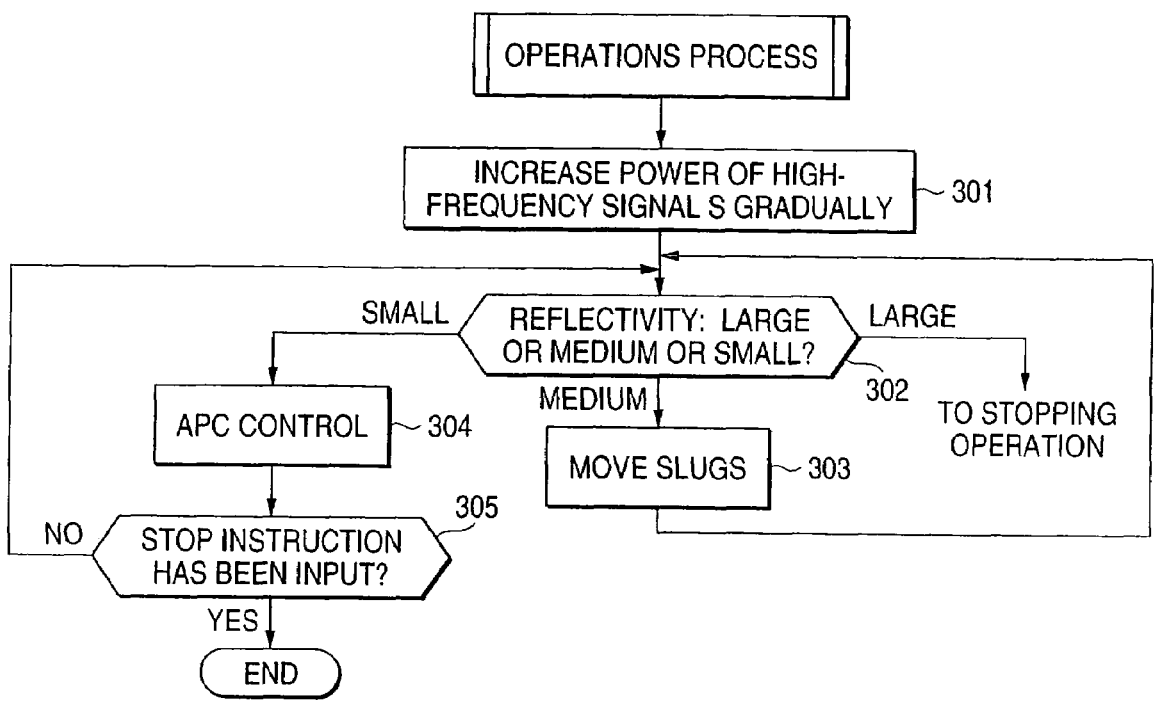
FIG. 7 is a flow chart for explaining an operations processing in FIG. 4.

In case the igniting processing normally ends, the calculation control unit 31 in the plasma CVD apparatus 1 executes the operations processing (at Step 300), as shown in FIG. 4. In this processing, the reactive gas is decomposed by the plasma discharge to form a thin film on the object. As shown in FIG. 7, more specifically, the calculation control unit 31 outputs the power control signal Sp to raise the electric power of the high-frequency signal S, as generated by the high-frequency generating unit 2, gradually to raise the intensity of the plasma in the treating chamber 5 to a target level (at Step 301).

Next, the calculation control unit 31 measures the reflectivity at the input end 11a of the matching device body 11, and determines the degree of the measured reflectivity (at Step 302) by comparing it with defined values. When it is determined that the measured reflectivity is extremely high (that is, the measured reflectivity is higher than a fourth defined value), the calculation control unit 31 determined it for some cause that the generation of the plasma has stopped in the treating chamber 5, and transfers to the stopping processing (at Step 400) shown in FIG. 4. When the measured reflectivity is slightly large (that, is when the measured reflectivity is not smaller than a fifth defined value and is not higher than the fourth defined value), on the other hand, the control amount Ss of the moving mechanism 21 is controlled to move the individual slugs 14 and 15 (at Step 303) thereby to lower the reflectivity so that the impedance between the high-frequency generating unit 2 and the treating chamber 5 may be matched to generate the plasma more efficiently. The calculation control unit 31 executes the operations of Steps 302 and 303 repeatedly. As a result, the reflectivity lowers. When it is determined at Step 302 that the measured reflectivity is not higher than the fifth defined value (that is, the reflectivity is low), the calculation control unit 31 outputs the power control signal Sp to subject the high-frequency generating unit 2 to an APC (Automatic Power Control) (at Step 304) so that the power of the high-frequency signal S may be constant. In this state, the impedance between the high-frequency generating unit 2 and the treating chamber 5 is in the matched state for an efficient plasma generation, and the power of the high-frequency signal S is controlled to a constant value. Therefore, the thin film forming treatment on the object in the treating chamber 5 is satisfactory. From now on, the calculation control unit 31 repeats the aforementioned individual Steps 302 to 304 and a later-described Step 305, to stabilize the intensity of the plasma in the treating chamber 5 at the target level while the object is being subjected to the thin film forming treatment. Here, the calculation control unit 31 detects whether or not the stop instruction has been inputted (at Step 305), while performing the APC control, and transfers to the stopping processing (of Step 400) when the input of the stop instruction is detected.

When the operations processing is normally ended, the stopping process (of Step 400) is executed (at Step 400). Specifically, the calculation control unit 31 outputs the power control signal Sp to lower the power of the high-frequency signal S being generated by the high-frequency generating unit 2, gradually to stop the plasma generation in the treating chamber 5.

Thus, according to this plasma CVD apparatus 1, the positions of the individual slugs 14 and 15 for matching the impedance in the unignited plasma state between the high-frequency generating unit 2 and the treating chamber 5 are detected and stored as the preset positions, and the high-frequency signal S is fed, when the plasma is to be ignited, in the state where the moving mechanism 21 is controlled to move the individual slugs 14 and 15 to those preset positions, so that the plasma can be reliably generated in the treating chamber 5 with the high-frequency signal S of the minimum power. At the ignition time, therefore, the high-frequency signal S of an excessive power can be reliably prevented from being fed to the treating chamber 5, thereby to avoid the abnormal discharge of the plasma. As a result, the object housed in the treating chamber 5 can be effectively prevented from being broken by an abnormal discharge of the plasma. Moreover, the plasma can be reliably generated so that the operations can be shifted for a short time to the thin film forming treatment and the etching treatment of the object using the plasma of the reactive gas. Therefore, it is possible to shorten the time period, as required for treating the object, sufficiently.

Here, the invention should not be limited to the aforementioned construction of the embodiment. For example, the embodiment of the invention has been described on the example, in which the plasma apparatus according to the invention is applied to the plasma CVD apparatus 1 acting as the semiconductor manufacturing apparatus for forming the thin film on the object such as the semiconductor wafer by the plasma discharge decomposition of the reactive gas. However, the invention could also be applied to the plasma etching apparatus for etching the thin film, as formed on the surface of the object such as the semiconductor wafer, wholly or partially by a predetermined thickness. Moreover, a variety of matching methods could be suitably adopted for the impedance matching method itself. Even after the ignition, moreover, the invention could adopt the construction, in which the calculation control unit 31 matches the impedance automatically between the high-frequency generating unit 2 and the treating chamber 5.

According to the plasma generating method of the first embodiment of the invention thus far described, the high-frequency generating unit is controlled to generate and feed the high-frequency signal having the lower power than that generating the plasma, to the treating chamber; the impedance matching device is controlled in this state on the basis of at least the reflectivity measured by the measuring unit to define the matching condition of the impedance matching device for the reflectivity lower than the first defined value, as the preset matching condition; the impedance matching device is controlled, when the plasma is generated in the treating chamber, so as to satisfy the preset matching condition; and then the high-frequency signal is fed to the treating chamber. Therefore, the plasma can be generated reliably and efficiently in the treating chamber with the high-frequency signal of the minimum power.

According to the plasma apparatus of the first embodiment of the invention, moreover, the high-frequency generating unit is controlled to generate and feed the high-frequency signal having a lower power than that generating the plasma, to the treating chamber; the impedance matching device is controlled on the basis of at least the reflectivity measured by the measuring unit in the condition, to define the positions, at which the reflectivity is lower than the first defined value, of the dielectrics in the impedance matching device, as preset positions; the moving mechanism is controlled, when the plasma is to be generated in the treating chamber, to move the dielectrics to the preset positions; and the high-frequency signal is then fed to the treating chamber. Therefore, the plasma can be generated reliably and efficiently in the treating chamber with the high-frequency signal of the minimum power.

According to the semiconductor manufacturing apparatus of the first embodiment of the invention, moreover, the plasma can be reliably generated in the treating chamber with the high-frequency signal of the minimum power. Therefore, the high-frequency signal of the excessive power can be prevented from being fed to the treating chamber so that the abnormal discharge of the plasma can be avoided. As a result, it is possible to prevent the object in the treating chamber from being broken by the abnormal discharge of the plasma. Moreover, the plasma can be reliably generated to make transfers within a short time period to the thin film forming treatment or the etching treatment of the object using the plasma of the reactive gas. Therefore, it is possible to sufficiently shorten the time period necessary for the treatments of the object.

Second Embodiment

Hereinafter, an example will be described in which the coaxial type impedance matching device is applied to a plasma apparatus 101, as a second embodiment. Moreover, the overlapping description of the plasma apparatus 101 will be omitted by designating the same components as those in the first embodiment by the common reference numerals.

Figure 8:
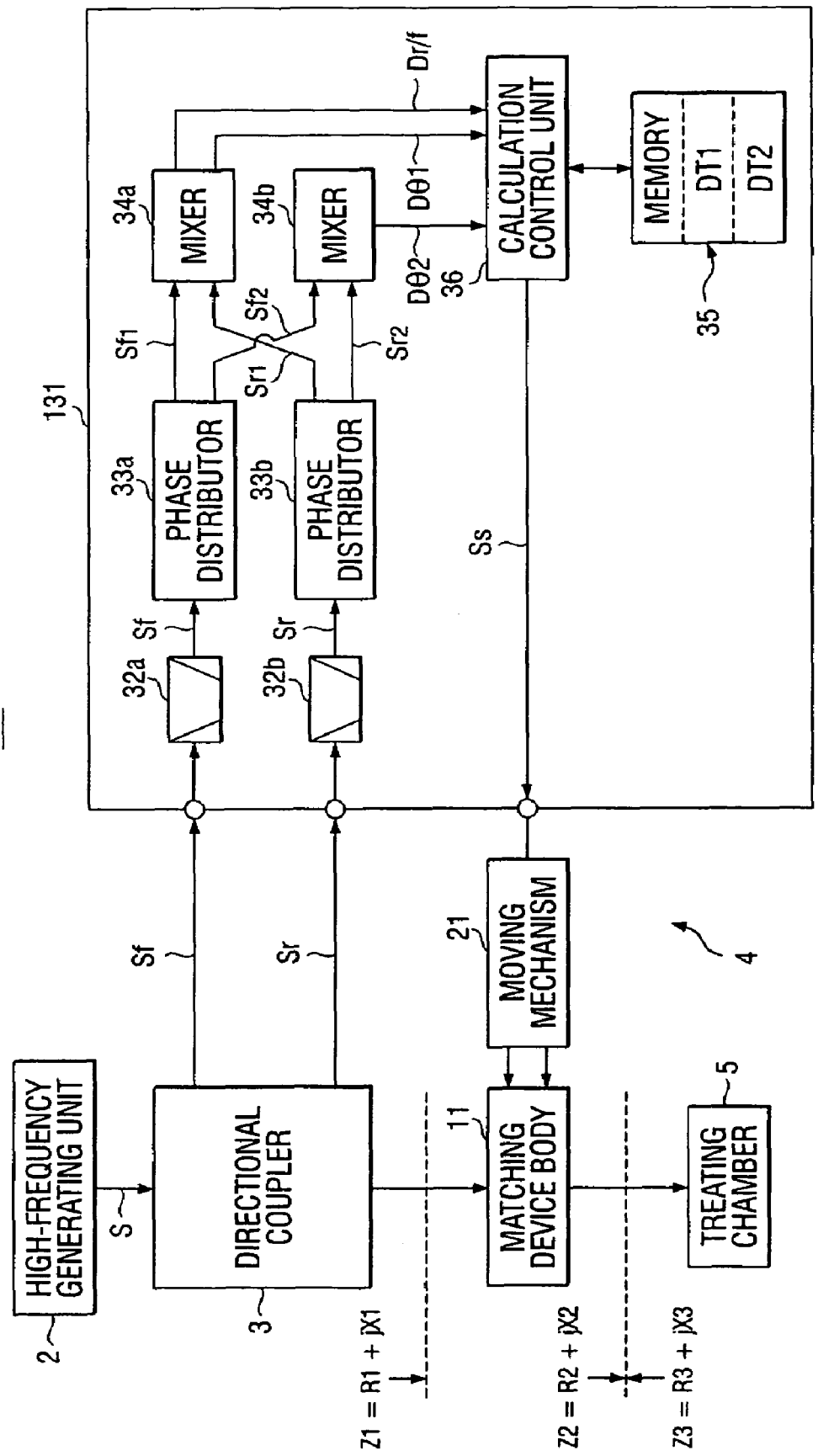
FIG. 8 is a construction diagram of a plasma apparatus 101 using a coaxial type impedance matching device 4 according to an embodiment of the invention.

The plasma apparatus 101, as shown in FIG. 8, is constructed to include a high-frequency generating unit 2, a directional coupler 3, a coaxial type impedance matching device (as will also be called the "matching device") 4 having a matching device body 11, and a treating chamber (or a matching object in the invention) 5. The plasma apparatus 101 is enabled to subject an object in the treating chamber 5 to a predetermined treatment, by feeding a high-frequency signal (e.g., a microwave) generated by the high-frequency generating unit 2 to the treating chamber 5 through the directional coupler 3 and the matching device body 11 thereby to generate a plasma in the treating chamber 5.

The high-frequency generating unit 2 generates the high-frequency signal (e.g., a microwave of about 2.45 GHz) S and feeds it to the treating chamber 5. The directional coupler 3 outputs the progressive wave Sf and the reflected wave Sr of the high-frequency signal S. In this case, the progressive wave Sf and the reflected wave Sr are related to have identical frequencies but different phases.

The control device 131 is provided, as shown in FIG. 8, with a first band-pass filter 32a, a second band-pass filter 32b, a first phase-shifting distributor (a first signal distributor) 33a, a second phase-shifting distributor (a second signal distributor) 33b, a first mixer 34a, a second mixer 34b, a memory (a storage unit in the invention) 35, and a calculation control unit (a calculation control unit and a control unit in the invention) 36. In this case, the band-pass filters 32a and 32b remove the noise components from the progressive wave Sf and the reflected wave Sr inputted, respectively.

The first phase-shifting distributor 33a is the so-called "hybrid circuit", and generates and distributes, on the basis of the progressive wave Sf as a first input signal inputted, a first generated signal Sf1 and a second generated signal Sf2, which have the same frequency as that of the progressive wave Sf and which have phases different from each other by a first reference phase difference. On the basis of the reflected wave Sr as a second input signal inputted, the second phase-shifting distributor 33b generates and distributes a third generated signal Sr1 and a fourth generated signal Sr2, which have the same frequency as that of the reflected wave Sr and which have either phases different from each other by a second reference phase difference or an identical phase. Here in this control device 131, for example, the first phase-shifting distributor 33a generates the first generated signal Sf1 having the same phase as that of the progressive wave Sf and the second generated signal Sf2 having the phase delayed by 90 degrees as the first reference phase difference from the phase of the first generated signal Sf1. On the other hand, the second phase-shifting distributor 33b is also a hybrid circuit equalizing the phase of the third generated signal Sr1 to the phase of the reflected wave Sr, and generates the third generated signal Sr1 and the fourth generated signal Sr2 in phase (this is equivalent to the second reference phase difference of 0 degrees). In short, the second phase-shifting distributor 33b functions as an in-phase distributor in the embodiment of the invention.

The first mixer 34a mixes the first generated signal Sf1 and the third generated signal Sr1, and detects the relative phase difference between the both generated signals Sf1 and Sr1 (i.e., the absolute value of the phase difference between the two signals Sf1 and Sr1) as a first relative phase difference Dθ1 and the amplitude ratio (Sr/Sf) Dr/f of the both generated signals Sf1 and Sr1. The second mixer 34b mixes the second generated signal Sf2 and the fourth generated signal Sr2, and detects the relative phase difference between the both generated signals Sf2 and Sr2 (i.e., the absolute value of the phase difference between the two signals Sf2 and Sr2) as a second relative phase difference Dθ2. Here could be adopted a construction, in which the amplitude ratio (Sr/Sf) of the both generated signals Sf2 and Sr2 is detected at the second mixer 34b and outputted as the aforementioned ratio Dr/f.

Figure 9:
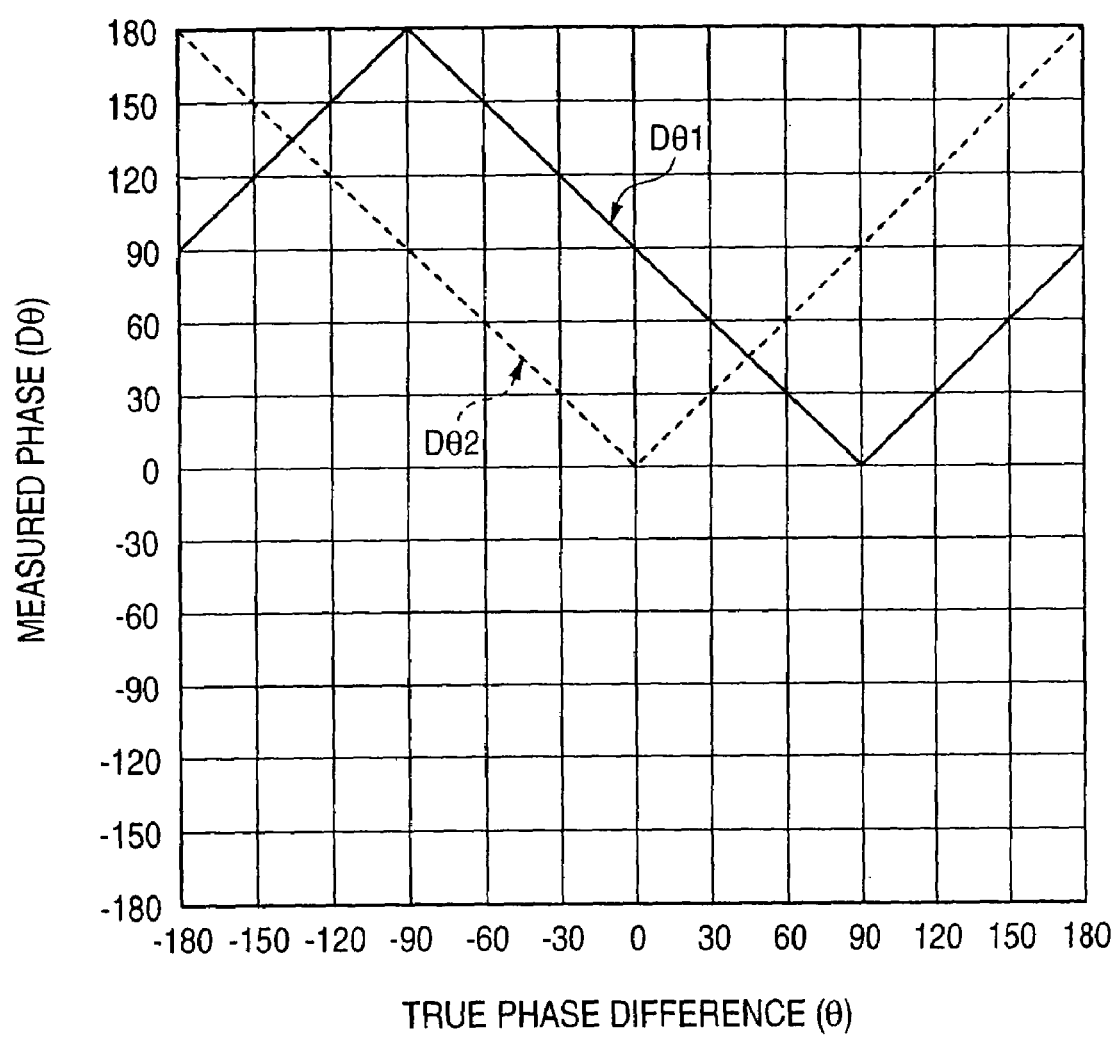
FIG. 9 is an explanatory diagram for explaining the contents of a data table DT1 stored in a memory 35.

The memory 35 stores in advance the individual values of the first relative phase difference Dθ1 and the second relative phase difference Dθ2, which are detected by the first mixer 34a and the second mixer 34b, respectively, when the phase difference (that is, the true phase difference) θ between the progressive wave Sf and the reflected wave Sr is changed from −180 degrees to +180 degrees, as a data table DT1 (see FIG. 9). The memory 35 stores in advance the individual values of the first relative phase difference Dθ1 and the second relative phase difference Dθ2 in a manner to correspond to the individual phase difference θ. Moreover, the memory 35 also stores in advance the individual intrinsic impedances of the matching device body 11, which correspond to the individual positions (i.e., distances L3 and L4 in FIG. 3) of individual slugs 14 and 15 in the matching device body 11, as a data table DT2.

The calculation control unit 36 calculates the phase difference θ between the progressive wave Sf and the reflected wave Sr by referring to the data table DT1 on the basis of the first relative phase difference Dθ1 and the second relative phase difference Dθ2, which are detected by the first mixer 34a and the second mixer 34b. In case the first relative phase difference Dθ1 detected is 150 degrees, for example, the calculation control unit 36 considers the two values of −120 degrees and −60 degrees as the phase difference θ determined on the basis of the first relative phase difference Dθ1, as shown in FIG. 9. In case that the second relative phase difference Dθ2 is detected as 120 degrees, on the other hand, the phase difference θ, which is determined on the basis of the second relative phase difference Dθ2, is −120 degrees and 120 degrees. Therefore, the common value of −120 degrees is calculated as the phase difference θ between the progressive wave Sf and the reflected wave Sr (which means, in this example, that the reflected wave Sr is delayed by 120 degrees from the progressive wave Sf). As a result, the calculation control unit 36 functions as a detection unit in the invention, and constructs a measuring device together with the first band-pass filter 32a, the second band-pass filter 32b, the firsts phase-shifting distributor 33a, the second phase-shifting distributor 33b, the first mixer 34a and the second mixer 34b.

Also, the calculation control unit 36 calculates an impedance Z1 (=R1+jX1) at the input end 11a of the matching device body 11 on the basis of the phase difference θ calculated and the amplitude ratio Dr/f detected by the first mixer 34a. In this case, the calculation control unit 36 obtains u=Dr/f×cosθ and v=Dr/f×sinθ, and calculates R1 and X1 on the basis of those values u and v and the following Formulae (1) and (2):

$$\left(u - \frac{R1}{(R1+1)}\right)^2 + v^2 = \frac{1}{(R1+1)^2} \quad (1)$$

$$(u-1)^2 + \left(v - \frac{1}{x1}\right)^2 = \frac{1}{x1^2} \quad (2)$$

Moreover, the calculation control unit 36 has functions to calculate the positions (the distances L3 and L4 in FIG. 3) of the individual slugs 14 and 15 in the matching device body 11 on the basis of a control quantity Ss for a moving mechanism 21 and to calculate the intrinsic impedance of the matching device body 11 at present with reference to the data table DT2. Also, the calculation control unit 36 has functions to calculate an input impedance Z3 (=R3+jX3) of the treating chamber 5, as viewed from the output end 11b of the matching device body 11, on the basis of the impedance Z1 at the input end 11a of the matching device body 11 and the calculated intrinsic impedance of the matching device body 11 at present, and functions as a calculation unit (forming part of the aforementioned measuring device) in the invention. The calculation control unit 36 has other functions: to calculate the conjugate impedance of (R3−jX3) to the impedance Z3 on the basis of the impedance Z3 calculated; to calculate the target distances (the matching positions), at which the output impedance Z2 (=R2+jX2) of the matching device body 11 is identical to the conjugate impedance of (R3−jx3), of the individual slugs 14 and 15 with reference to the data table DT2; and to control the control quantity Ss for the moving mechanism 21, to move the individual slugs 14 and 15 to the matching positions thereby to match the impedance between the directional coupler 3 and the treating chamber 5.

Figure 10:
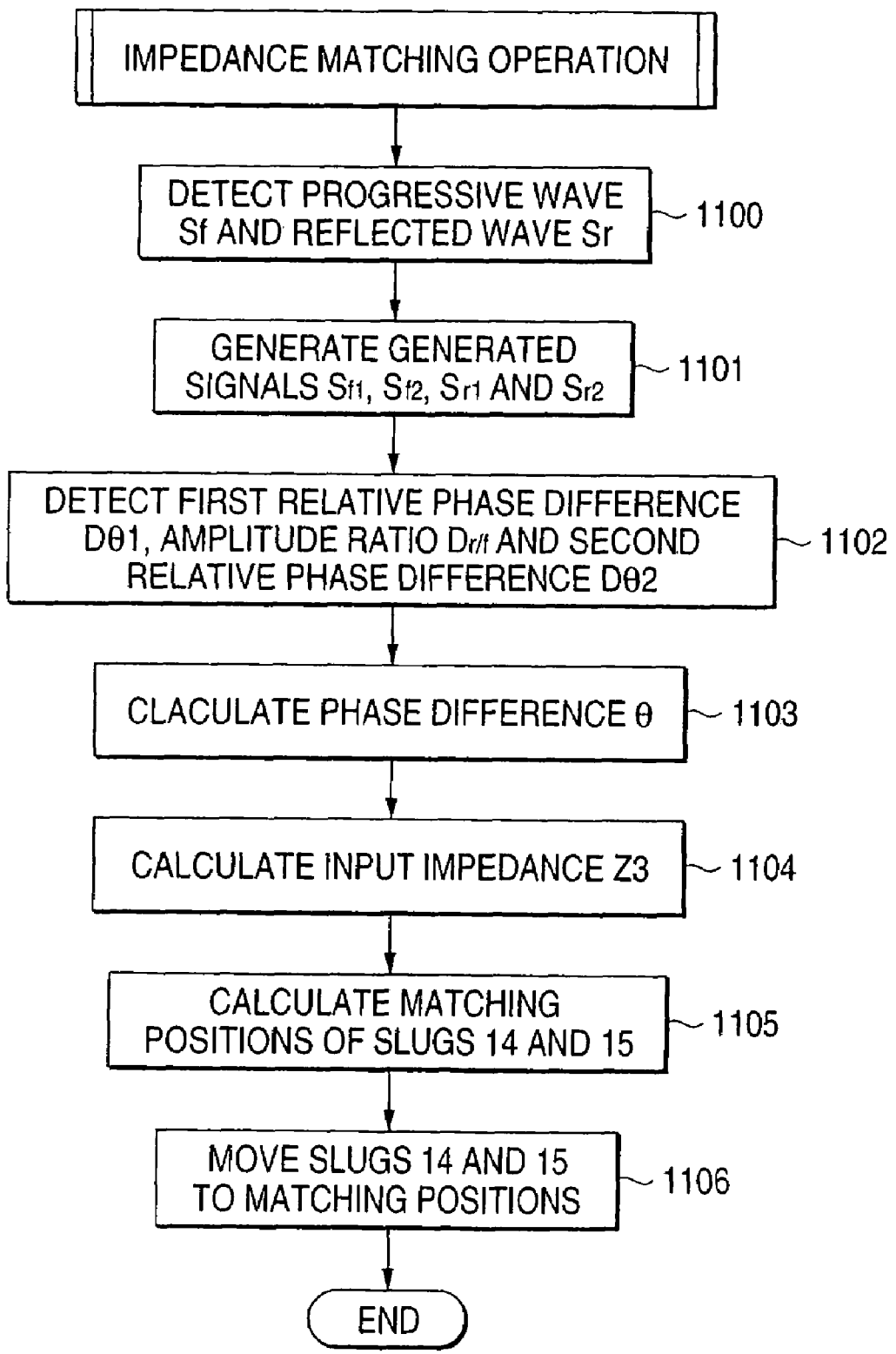
FIG. 10 is a flow chart for explaining an impedance matching operation by a matching device 4.

Next, a phase difference detecting method and an impedance detecting method according to the invention will be described together with the impedance matching actions of the matching device 4 with reference to FIG. 10.

When the generation of the high-frequency signal S is started by the high-frequency generating unit 2, the directional coupler 3 in the matching device 4 detects and outputs the progressive wave Sf and the reflected wave Sr (at Step 1100). In this case, the progressive wave Sf and the reflected wave Sr are so related to each other that their frequencies are identical but their phases are different by θ. Next, the first phase-shifting distributor 33a inputs the progressive wave Sf and generates the first generated signal Sf1 and the second generated signal Sf2, and the second phase-shifting distributor 33b inputs the reflected wave Sr and generates the third generated signal Sr1 and the fourth generated signal Sr2 (at Step 1101: Signal Generating Step).

Next, the first mixer 34a mixes the two generated signals Sf1 and Sr1, and detects the analog quantities corresponding to the first relative phase difference D$\theta$1 and the amplitude ratio Dr/f, as contained in the mixed signal, to output them as digital data or an analog signal (although this example uses the digital data). And, the second mixer 34b mixes the generated signals Sf2 and Sr2, and detects the analog quantities corresponding to the second relative phase difference D$\theta$2, as contained in the mixed signal, to output them as digital data or an analog signal (although this example uses the digital data) (at Step 1102: Relative Phase Difference Detecting Step; and Amplitude Ratio Detecting Step). Next, on the basis of the first relative phase difference D$\theta$1 and the second relative phase difference D$\theta$2, the calculation control unit 36 calculates the true phase difference $\theta$ between the progressive wave Sf and the reflected wave Sr with reference to the data table DT1 (at Step 1103).

Next, the calculation control unit 36 calculates the input impedance Z3 of the treating chamber 5 (at Step 1104). Specifically, the calculation control unit 36 calculates the impedance Z1 at the input end 11a of the matching device body 11 on the basis of the phase difference $\theta$ and the amplitude ratio Dr/f calculated. Moreover, the calculation control unit 36 the present positions (that is, at the matching action starting time) of the individual slugs 14 and 15 (e.g., the distances L3 and L4 in FIG. 3) in the matching device body 11 on the basis of the present control quantities Ss for the moving mechanism 21, and calculates the intrinsic impedance of the matching device body 11 at the matching action starting time with reference to the data table DT2. Still moreover, the calculation control unit 36 calculates the input impedance Z3 of the treating chamber 5 (or the matching object) on the basis of the calculated impedance Z1 at the input end 11a of the matching device body 11 and the intrinsic impedance of the matching device body 11.

On the basis of the impedance Z3 calculated, the calculation control unit 36 then calculates the matching positions of the individual slugs 14 and 15 for matching the impedance between the high-frequency generating unit 2 and the treating chamber 5 (at Step 1105). Specifically, the calculation control unit 36 calculates the conjugate impedance of (R3−jX3) to the calculated impedance Z3, and calculates the matching positions of the individual slugs 14 and 15, at which the output impedance Z2 of the matching device body 11 is identical to the conjugate impedance of (R3−jX3), with reference to the data table DT2.

Finally, the calculation control unit 36 controls the control quantities Ss for the moving mechanism 21, to move the individual slugs 14 and 15 to the matching positions (at Step 1106). Therefore, the impedance matching performance between the high-frequency generating unit 2 and the treating chamber 5 is completed, so that the high-frequency signal S generated by the high-frequency generating unit 2 is efficiently fed to the treating chamber 5.

In the related art, the matching positions (the target positions) of the individual slugs for matching the impedance between the high-frequency generating unit and the treating chamber in the matching device body are individually calculated on the basis of the progressive wave and the reflected wave so that the matching positions of the individual slugs as the matching elements are determined by moving the individual slugs directly to those calculated matching positions while repeating the feedback controls. Unlike this related art, however, these feedback controls can be eliminated according to the matching device 4. As a result, it is possible to do the impedance matching performance at an extremely high speed. Moreover, the impedance matching performance can be so done as to establish the extremely complete matching state by controlling the movements of the slugs 14 and 15 to positions for the complete impedance matching performance.

As the example, in which the calculation control unit 36 acting as a detecting unit in the invention detects the true phase difference between the progressive wave Sf and the reflected wave Sr on the basis of the two relative phase differences D$\theta$1 and D$\theta$2 detected by the two mixers 34a and 34b, the first reference phase difference (of 90 degrees) and the phase difference (of 0 degrees) between the third generated signal Sr1 and the fourth generated signal Sr2, moreover, the aforementioned embodiment of the invention has been described on the example, in which the true phase difference $\theta$ between the progressive wave Sf and the reflected wave Sr is calculated on the basis of the first relative phase difference D$\theta$1 and the second relative phase difference D$\theta$2, as detected, with reference to the data table DT1 which has been so prepared in advance that the two relative phase differences D$\theta$1 and D$\theta$2 detected when the true phase difference $\theta$ is changed. Despite of this description, however, the invention should not be limited thereto. For example, there could also be adopted the construction, in which the true phase difference $\theta$ between the progressive wave Sf and the reflected wave Sr is detected, each time the calculation control unit 36 inputs the two relative phase differences D$\theta$1 and D$\theta$2, by calculations based on the two relative phase differences D$\theta$1 and D$\theta$2, the first reference phase difference (of 90 degrees in this example) and the phase difference (of 0 degrees in this example) between the third generated signal Sr1 and the fourth generated signal Sr2.

Moreover, the moving mechanism in the invention could also be constructed by substituting timing belts, steel belts, V-belts, flat belts and gears (e.g., racks and pinions) for the wire ropes 22a and 22b. Moreover, the moving mechanism could also be constructed by using not the belts but ball screws. In addition, the embodiment of the invention has been described on the example, in which the coaxial type impedance matching device is applied to the plasma apparatus 101. However, the coaxial type impedance matching device could also be applied to impedance matching performances between various devices, such as the impedance matching performance between the amplifier and the antenna in a transmitter.

According to the phase difference detecting method and the measuring device of the second embodiment of the invention, as has been described hereinbefore, on the basis of the first one of a first input signal and a second input signal, which are identical in frequency to each other but different in phase from each other, a first generated signal and a second generated signal, which are identical in frequency to and different by a first reference phase difference from the first input signal are generated. A third generated signal and a fourth generated signal, which are identical in frequency but different by a second reference phase difference from the second input signal are generated on the basis of the second input signal. A relative phase difference between the first and third generated signals is detected by mixing the first generated signal and the third generated signal, and a relative phase difference between the second and fourth generated signals is detected by mixing the second generated signal and the fourth generated signal. By detecting the phase difference between the first input signal and the second input signal on the basis of the two parameters of the first relative phase difference and the second relative phase difference, it is possible to accurately detect the phase difference (or the true phase difference) between the two input signals, as containing the advance or delay information of one input signal on the other input signal.

According to the phase difference detecting method and the measuring device of the second embodiment of the invention, moreover, at the signal generating step, the third generated signal and the fourth generated signal are generated with the first reference phase difference being at 90 degrees and with the individual phases being identical. As a result, the true phase difference between the two input signals can be most easily detected.

According to the impedance detecting method and the measuring device of the second embodiment of the invention, moreover, the true phase difference is detected according to the aforementioned phase difference detecting method by using a progressive wave and a reflected wave outputted by a directional coupler connected with a connection object, individually as the first input signal and the second input signal, and either the step of detecting the amplitude ratio of the first generated signal and the third generated signal by mixing the two generated signals or the step of detecting the amplitude ratio of the second generated signal and the fourth generated signal by mixing the two generated signals is executed as an amplitude ratio detecting step, so that the input impedance of the connection object is detected on the basis of the true phase difference detected by the phase difference detecting method and the amplitude ratio detected at the amplitude ratio detecting step. As a result, the input impedance of the connection object can be detected reliably and accurately.

According to the coaxial type impedance matching device of the second embodiment of the invention, moreover, the control unit calculates the input impedance of the matching object on the basis of both the intrinsic impedance, as determined from the individual positions of the individual dielectrics in the matching device body and the data table, of the matching device body at a matching action starting time and the input impedance, as calculated in the state by the calculation unit of the measuring device, of the matching device body as the connection object, and calculates the individual positions, at which a conjugate impedance to the calculated input impedance of the matching object and the intrinsic impedance are identical, of the individual dielectrics as target positions with reference to the data table, thereby to control the moving mechanism so that the individual dielectrics may be positioned at the target positions. Unlike the related art in which the matching positions of the matching elements are determined while repeating the feedback controls, therefore, these feedback controls can be eliminated to do the impedance matching performance at a remarkably high speed. Moreover, the movements of the dielectrics are controlled to position the dielectrics at the complete impedance matching positions so that the impedance matching performance can be done in a remarkably complete matching state.

What is claimed is:

1. A phase difference detecting method comprising:
inputting a first input signal and a second input signal, which are identical in frequency to each other and are different in phase from each other;
generating a first generated signal and a second generated signal, which are identical in frequency and different by a first reference phase difference from the first input signal, on the basis of the first input signal;
generating a third generated signal and a fourth generated signal, which are identical in frequency and are different by a second reference phase difference from the second input signal, on the basis of the second input signal;
mixing the first generated signal and the third generated signal to detect relative phase difference between the first generated signal and the third generated signal, as a first relative phase difference;
mixing the second generated signal and the fourth generated signal to detect relative phase difference between the second generated signal and the fourth generated signal, as a second relative phase difference; and
referring to a relationship prepared in advance among the first relative phase difference, the second relative phase difference, and a true phase difference between the first input signal and the second input signal, to detect the true difference.

2. The phase difference detecting method according to claim 1, wherein:
the first reference phase difference is 90 degrees; and
the second reference phase difference is 0 degree.

3. A measuring device comprising:
a first signal distributor for generating and distributing a first generated signal and a second generated signal, which are identical to each other in frequency and are different by a first reference phase difference from a first input signal inputted, on the basis of the first input signal;
a second signal distributor to which a second input signal having the frequency identical to the first input signal and being different in phase from the first input signal is input, the second signal distributor for generating and distributing a third generated signal and a fourth generated signal, which are identical to each other in frequency and are different by a second reference phase difference, on the basis of the second input signal;
a first mixing unit for mixing the first generated signal and the third generated signal to detect a relative phase difference between the first generated signal and the third generated signal as a first relative phase difference;
a second mixing unit for mixing the second generated signal and the fourth generated signal to detect a relative phase difference between the second generated signal and the fourth generated signal as a second relative phase difference; and
a detecting unit for detecting a true phase difference between the first input signal and the second input signal on the basis of the first relative phase difference and the second relative phase difference detected by the first mixing unit and the second mixing unit, the first reference phase difference, and the second reference phase difference.

4. The measuring device according to claim 3, wherein:
the first reference phase difference is 90 degrees; and
the second reference phase difference is 0 degree.

5. The measuring device according to claim 3, further comprising:
a directional coupler connected to an object to be connected, the first signal distributor, and the second signal distributor; and
a calculation unit for calculating an input impedance of the object to be connected, wherein:

the first input signal and the second input signal, which are output by the directional coupler, are input to the first signal distributor and the second signal distributor, respectively;

one of the first mixing unit and the second mixing unit mixes the both generated signals to detect an amplitude ratio of the both generated signals; and the calculation unit calculates the input impedance of the object to be connected on the basis of the true phase difference between the first input signal and the second input signal, which is detected by the detecting unit, and the detected amplitude ratio.

* * * * *